United States Patent
Kim et al.

(10) Patent No.: US 7,983,106 B2
(45) Date of Patent: Jul. 19, 2011

(54) VOLTAGE STABILIZATION CIRCUIT AND SEMICONDUCTOR MEMORY APPARATUS USING THE SAME

(75) Inventors: Yong-Mi Kim, Gyeonggi-do (KR); Jeong-Tea Hwang, Gyeonggi-do (KR); Jeong-Hun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 86 days.

(21) Appl. No.: 12/494,815

(22) Filed: Jun. 30, 2009

(65) Prior Publication Data

US 2010/0290304 A1    Nov. 18, 2010

(30) Foreign Application Priority Data

May 15, 2009 (KR) .................... 10-2009-0042341

(51) Int. Cl.
*G11C 5/14* (2006.01)
(52) U.S. Cl. ........ 365/226; 365/228; 323/304; 323/312; 327/540; 327/538; 327/543
(58) Field of Classification Search .................. 365/226; 323/304, 312; 327/540, 538, 543
See application file for complete search history.

(56) References Cited

U.S. PATENT DOCUMENTS

| | | | | |
|---|---|---|---|---|
| 5,132,932 A * | 7/1992 | Tobita | ........................... | 365/222 |
| 5,377,156 A * | 12/1994 | Watanabe et al. | ............. | 365/227 |
| 5,917,765 A * | 6/1999 | Morishita et al. | ............. | 365/201 |
| 6,166,562 A * | 12/2000 | Mita et al. | ........................ | 326/83 |
| 6,297,624 B1 * | 10/2001 | Mitsui et al. | ................... | 323/316 |
| 6,310,511 B1 * | 10/2001 | Weinfurtner | .................. | 327/540 |
| 6,362,656 B2 * | 3/2002 | Rhee | ............................... | 326/87 |
| 7,035,148 B2 * | 4/2006 | Chung et al. | ............ | 365/189.05 |
| 7,256,628 B2 * | 8/2007 | Drost et al. | .................... | 327/147 |
| 7,342,412 B2 * | 3/2008 | Kim | ............................... | 326/30 |
| 7,468,628 B2 * | 12/2008 | Im et al. | ........................ | 327/548 |
| 7,501,867 B2 * | 3/2009 | Poulton et al. | ................ | 327/156 |
| 7,739,535 B2 * | 6/2010 | Ha et al. | ........................ | 713/500 |
| 2007/0152706 A1 | 7/2007 | Seo et al. | | |

FOREIGN PATENT DOCUMENTS

| JP | 2002-300591 A | 11/2002 |
|---|---|---|
| JP | 2003-258612 A | 12/2003 |
| KR | 102007011513 | 5/2007 |

* cited by examiner

*Primary Examiner* — Viet Q Nguyen
(74) *Attorney, Agent, or Firm* — Venable LLP; Jeffri A. Kaminski

(57) ABSTRACT

A voltage stabilization circuit of a semiconductor memory apparatus includes an operation speed detecting unit configured to detect an operation speed of the semiconductor memory apparatus to generate a detection signal, and a voltage line controlling unit configured to interconnect a first voltage line and a second voltage line in response to the detection signal.

22 Claims, 4 Drawing Sheets

US 7,983,106 B2

VOLTAGE STABILIZATION CIRCUIT AND SEMICONDUCTOR MEMORY APPARATUS USING THE SAME

CROSS-REFERENCES TO RELATED APPLICATION

The present application claims priority under 35 U.S.C. 119(a) to Korean application number 10-2009-0042341, filed on May 15, 2009, in the Korean Intellectual Property Office, which is incorporated by reference in its entirety as if set forth in full.

BACKGROUND OF THE INVENTION

1. Technical Field

The embodiment described herein relates to a semiconductor integrated circuit. More particularly, the embodiment described herein relates to a voltage stabilization circuit and a semiconductor memory apparatus using the same.

2. Related Art

A semiconductor memory apparatus operates in response to external voltage.

In order to stably output data, the semiconductor memory apparatus receives voltage, which is dedicated for a data output circuit and is not supplied to other circuits. In order to distinguish a voltage supplied to other circuits from the voltage supplied to the data output circuit, the voltage supplied to other circuits will be referred to as external voltage and ground voltage, and the voltage supplied to the data output circuit will be referred to as external voltage for data output and ground voltage for data output. The external voltage, the ground voltage, the external voltage for the data output and the ground voltage for the data output are supplied to the semiconductor memory apparatus through pads of the semiconductor memory apparatus. The external voltage has a level equal to a level of the external voltage for the data output, and the ground voltage has a level equal to a level of the ground voltage for the data output.

As the semiconductor memory apparatus operates at a higher speed with higher capacity, the semiconductor memory apparatus is designed such that the semiconductor memory apparatus can output a larger amount of data at one time. Thus, since a data output circuit outputs a larger amount of data at one time, the data output circuit consumes a larger amount of current. At this time, a level of the external voltage for the data output and a level of the ground voltage for the data output may be changed. Further, as an operation speed of the semiconductor memory apparatus is increased, the level change of the external voltage for the data output and the ground voltage for the data output may become severe.

SUMMARY

A voltage stabilization circuit and a semiconductor memory apparatus using the same, which can prevent noise of voltage used for data output even if an operation speed of a semiconductor memory apparatus is increased, are described herein.

According to an embodiment, a voltage stabilization circuit of a semiconductor memory apparatus includes an operation speed detecting unit configured to detect an operation speed of the semiconductor memory apparatus to generate a detection signal, and a voltage line controlling unit configured to interconnect a first voltage line and a second voltage line in response to the detection signal.

According to another embodiment, a voltage stabilization circuit of a semiconductor memory apparatus includes an operation speed detecting unit configured to detect an operation speed of the semiconductor memory apparatus to generate a detection signal, and a voltage line controlling unit configured to allow a part of current applied to a first voltage line to be applied to a second voltage line in response to the detection signal.

According to another embodiment, a semiconductor memory apparatus includes a voltage stabilization circuit configured to distribute a part of current, which is applied to a first voltage line, to a second voltage line when an operation speed of the semiconductor memory apparatus is equal to or faster than a predetermined operation speed, and a data output circuit configured to receive voltage from the first voltage line to output data out of the semiconductor memory apparatus. The second voltage line applies voltage to a circuit except for the data output circuit.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
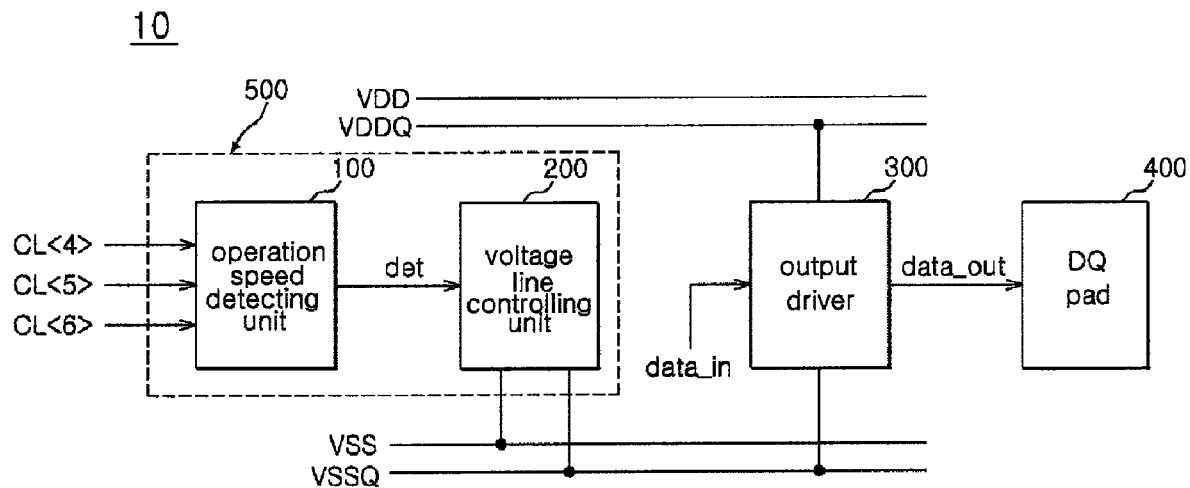
FIG. 1 is a block diagram schematically showing a structure of an example of a voltage stabilization circuit of a semiconductor memory apparatus according to an embodiment.

As shown in FIG. 1, a voltage stabilization circuit 500 of a semiconductor memory apparatus 10 according to an embodiment can include an operation speed detecting unit 100 and a voltage line controlling unit 200. Further, the semiconductor memory apparatus 10 employing the voltage stabilization circuit 500 can further include an output driver 300 and a DQ pad 400.

The operation speed detecting unit 100 can be configured to enable a detection signal 'det' if an operation speed of the semiconductor memory apparatus 10 is equal to or faster than a predetermined operation speed.

In detail, the operation speed detecting unit 100 according to the embodiment enables the detection signal 'det' if the fourth to the sixth operation speed information signals 'CL<4:6>' of the first to the sixth operation speed information signals 'CL<1:6>' are enabled. The first to the sixth operation speed information signals 'CL<1:6>' may include CAS latency signals. As the operation speed of the semiconductor memory apparatus 10 is increased, a CAS latency value is increased, so the CAS latency signal can be used as the operation speed information signals. Further, the first to the sixth operation speed information signals 'CL<1:6>' may be preset in a mode register set (MRS).

In more detail, the operation speed detecting unit 100 can enable the detection signal 'det' if one of the fourth to the sixth operation speed information signals 'CL<4:6>' is enabled.

Figure 2:
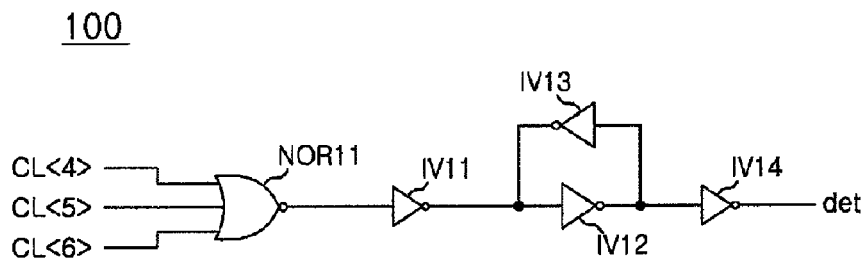
FIG. 2 is a circuit diagram showing a structure of an example of an operation speed detecting unit shown in FIG. 1.

As shown in FIG. 2, the operation speed detecting unit 100 can include a NOR gate 'NOR 11', and first to fourth inverters IV11 to IV14. The NOR gate 'NOR 11' can receive the fourth to the sixth operation speed information signals 'CL<4:6>'. The first inverter IV11 is configured to receive an output signal of the NOR gate 'NOR 11'. The second inverter IV12 is configured to receive an output signal of the first inverter IV11. The third inverter 'IV13' is configured to receive an output signal of the second inverter IV12, and output the received signal as an input signal of the second inverter IV12. The fourth inverter IV14 is configured to receive the output signal of the second inverter IV12, and to invert the received signal to output the inverted signal as the detection signal 'det'.

If the detection signal 'det' is enabled, the voltage line controlling unit 200 can interconnect a ground voltage line 'VSS' and a ground voltage line 'VSSQ' for data output. For example, the ground voltage line 'VSSQ' for the data output can supply ground voltage to a data output circuit, e.g., the output driver 300, and the ground voltage line 'VSS' can supply the ground voltage to circuits except for the data output circuit.

Figure 3:
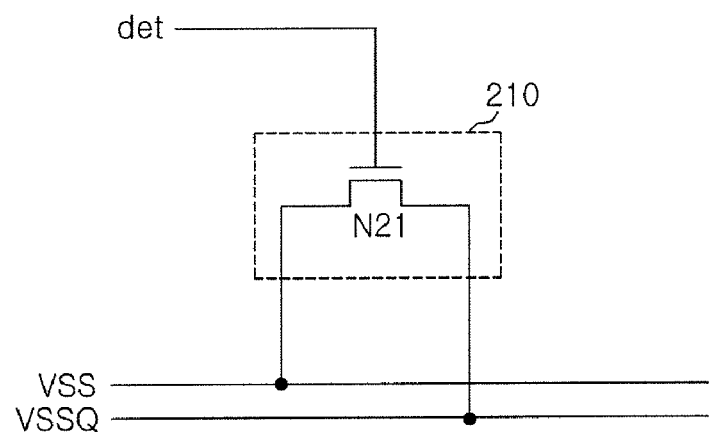
FIG. 3 is a circuit diagram showing a structure of an example of a voltage line controlling unit shown in FIG. 1.

As shown in FIG. 3, the voltage line controlling unit 200 can include a switching unit 210.

The switching unit 210 can include a transistor N21. The transistor N21 can include a gate, which receives the detection signal 'det', a drain connected with the ground voltage line 'VSS', and a source connected with the ground voltage line 'VSSQ' for the data output.

As shown in FIG. 1, the output driver 300 can receive and drive data 'data_in' to output the driven data 'data_out' to the DQ pad 400. The output driver 300 corresponds to the data output circuit and can be connected with an external voltage line 'VDDQ' for data output and the ground voltage line 'VSSQ' for the data output. The external voltage line 'VDDQ' for the data output has a level the same as a level of an external voltage line 'VDD'. The external voltage line 'VDD', the ground voltage line 'VSS', the external voltage line 'VDDQ' for the data output and the ground voltage line 'VSSQ' can be connected with voltage supply pads (not shown) to receive voltage from the exterior.

The voltage stabilization circuit of the semiconductor memory apparatus according to the embodiment operates as follows.

According to the semiconductor memory apparatus of the embodiment, it is assumed that one to six CAS latency signals 'CL' represent the operation speed of the semiconductor memory apparatus. However, the disclosure is not limited thereto.

The operation speed detecting unit 100 enables the detection signal 'det' in response to the fourth to the sixth operation speed information signals 'CL<4:6>' of the first to the sixth operation speed information signals 'CL<1:6>'. In more detail, the operation speed detecting unit 100 enables the detection signal 'det' if one of the fourth to the sixth operation speed information signals 'CL<4:6>' is enabled.

If the detection signal 'det' is enabled, the voltage line controlling unit 200 can interconnect the ground voltage line 'VSS' and the ground voltage line 'VSSQ' for the data output. As shown in FIG. 1, the ground voltage line 'VSSQ' for the data output is connected with the data output circuit, e.g., the output driver 300.

Thus, when the semiconductor memory apparatus operates at an operation speed corresponding to the first to the third operation speed information signals 'CL<1:3>', the ground voltage line 'VSS' is separated from the ground voltage line 'VSSQ' for the data output. However, when the semiconductor memory apparatus operates at an operation speed corresponding to the fourth to the sixth operation speed information signals 'CL<4:6>', the ground voltage line 'VSS' is connected with the ground voltage line 'VSSQ' for the data output.

That is, the voltage stabilization circuit of the semiconductor memory apparatus according to the embodiment can separate the ground voltage line from the ground voltage line for the data output at a low speed operation (operation speed when one of the first to the third operation speed information signals 'CL<1:3>' is enabled), and can interconnect the ground voltage line and the ground voltage line for the data output at a high speed operation (operation speed when one of the fourth to the sixth operation speed information signals 'CL<4:6>' is enabled), so that noise of the voltage applied to the ground voltage line for the data output during the high speed operation can be applied to the ground voltage line. The voltage stabilization circuit can distribute the noise on the ground voltage line for the data output to the ground voltage line, so that the noise on the ground voltage line for the data output can be reduced. The ground voltage line has a capacitance greater than a capacitance of the ground voltage line for the data output, so the ground voltage line has a superior noise reduction ability.

If the noise on the ground voltage line for the data output is reduced, the data output circuit (e.g., the output driver) connected with the ground voltage line for the data output is less affected by the voltage noise, so jitter components of data output from the data output circuit can be reduced.

Figure 4:
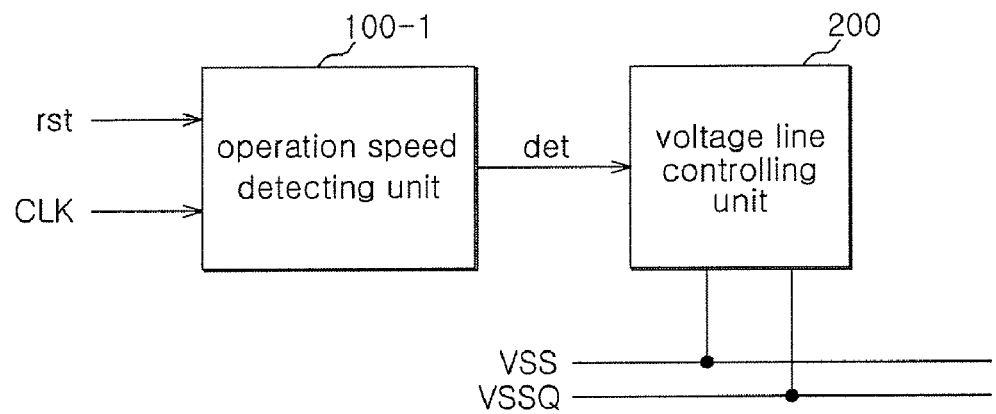
FIG. 4 is a block diagram schematically showing a structure of an example of a voltage stabilization circuit of a semiconductor memory apparatus according to another embodiment.

As shown in FIG. 4, a voltage stabilization circuit of the semiconductor memory apparatus according to another embodiment of the disclosure can include an operation speed detecting unit 100-1 and the voltage line controlling unit 200.

After a reset signal 'rst' is disabled, the operation speed detecting unit 100-1 is configured to detect an operation speed of the semiconductor memory apparatus to generate the detection signal 'det'. That is, after the reset signal 'rst' is disabled, if the operation speed of the semiconductor memory apparatus is equal to or faster than a predetermined operation speed, the operation speed detecting unit 100-1 enables the detection signal 'det'. For example, the operation speed detecting unit 100-1 can detect a period of a clock 'CLK', which represents the operation speed of the semiconductor memory apparatus, thereby generating the detection signal 'det'.

Figure 5:
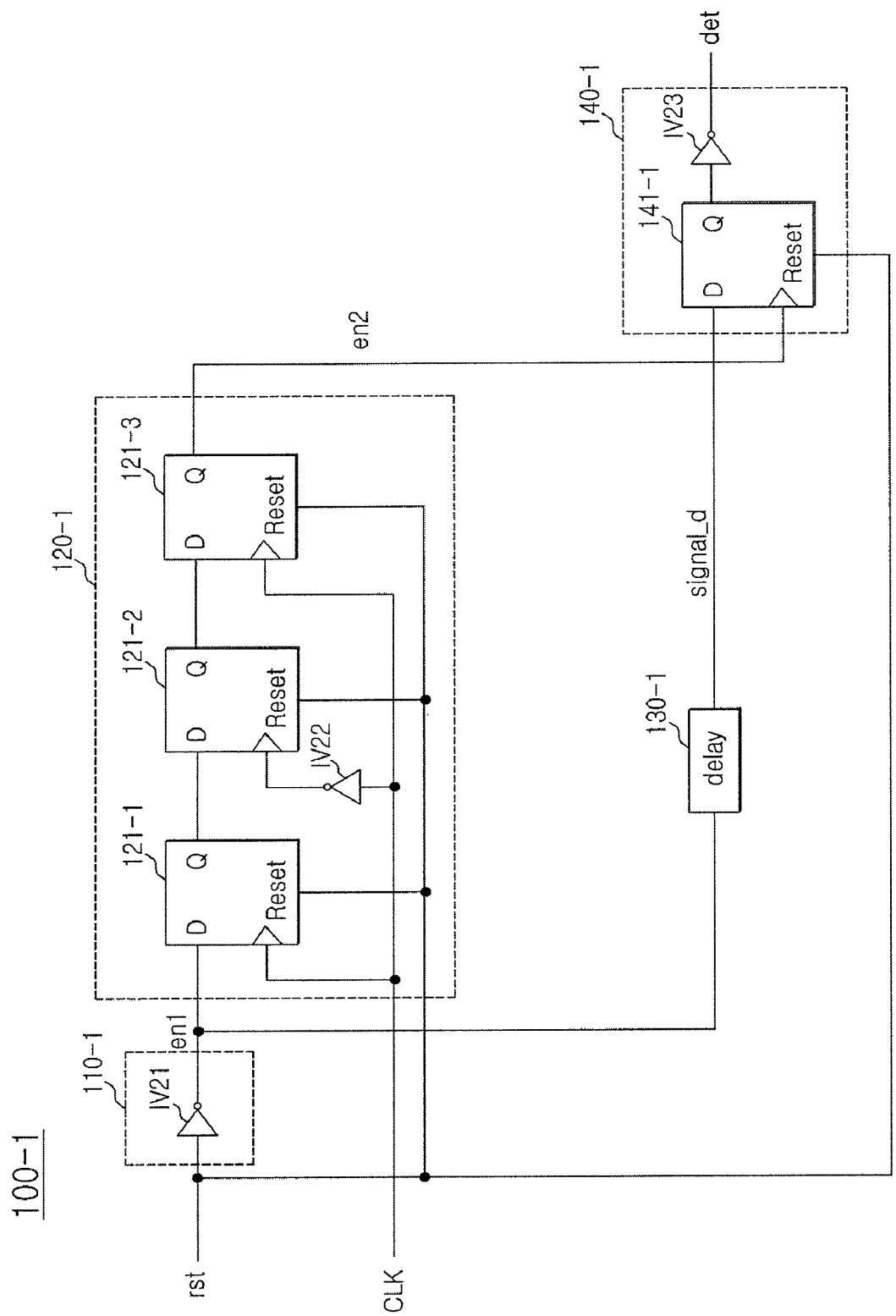
FIG. 5 is a circuit diagram showing a structure of an example of an operation speed detecting unit shown in FIG. 4.
Figure 6:
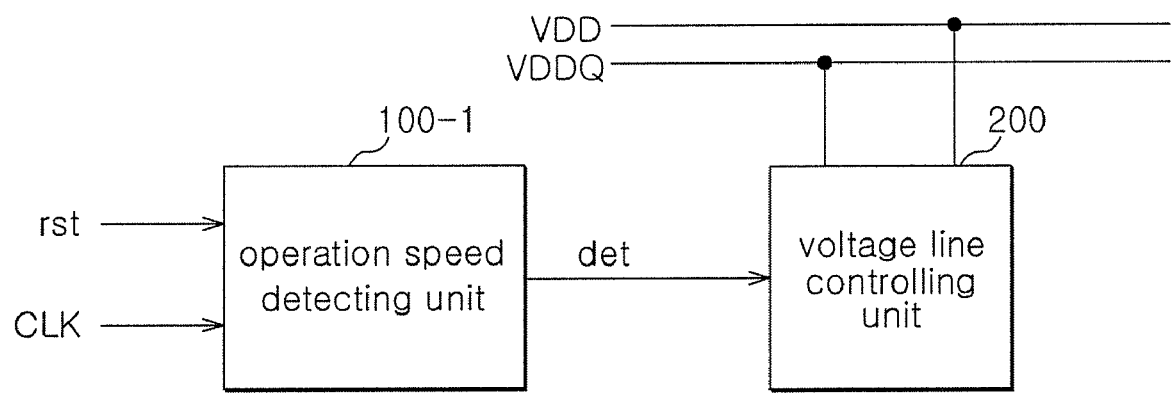
FIG. 6 is a block diagram schematically showing a structure of an example of a voltage stabilization circuit of a semiconductor memory apparatus according to another embodiment.

As shown in FIG. 5, after the reset signal 'rst' is disabled, if the period of the clock 'CLK' is shorter than a predetermined period (e.g., one period of the clock 'CLK'), the operation speed detecting unit 100-1 is configured to enable the detection signal 'det'.

In more detail, the operation speed detecting unit 100-1 can generate a first enable signal 'en1' enabled if the reset signal 'rst' is disabled, delay the first enable signal 'en1' for a predetermined time, delay the first enable signal 'en1' for one period of the clock 'CLK', and generate the detection signal 'det' by comparing enabling timing of the signal delayed for the predetermined time with enabling timing of the signal delayed for one period of the clock 'CLK'.

The operation speed detecting unit 100-1 can include an enable signal generator 110-1, a clock delay unit 120-1, a delay unit 130-1 and a timing comparator 140-1.

The enable signal generator 110-1 can generate the first enable signal 'en1' enabled at a high level if the reset signal 'rst' is disabled at a low level.

In detail, the enable signal generator 110-1 can include a first inverter IV21. The first inverter IV21 can receive and invert the reset signal 'rst' to output the inverted signal as the first enable signal 'en1'.

The clock delay unit 120-1 can output the first enable signal 'en1' as a second enable signal 'en2' after one period of the clock 'CLK'.

In detail, the clock delay unit 120-1 can include first to third flip-flops 121-1 to 121-3, and a second inverter IV22. The second inverter IV22 is configured to receive the clock 'CLK'. The first to third flip-flops 121-1 to 121-3 are configured to be serially connected with each other, the first flip-flop 121-1 and the third flip-flop 121-3 are configured to receive the clock 'CLK', and the second flip-flop 121-2 is configured to receive an output signal of the second inverter IV22. Further, the first to third flip-flops 121-1 to 121-3 are initialized if the reset signal 'rst' is enabled at a high level.

The delay unit 130-1 can delay the first enable signal 'en1' for the predetermined delay time to output a delay signal 'signal_d'. Although not shown in FIG. 5, the delay unit 130-1 may be a normal RC delay or a normal inverter chain.

The timing comparator 140-1 can generate the detection signal 'det' by comparing enabling timing of the second enable signal 'en2' with enabling timing of the delay signal 'signal_d'. For example, the timing comparator 140-1 can output the detection signal 'det' by inverting a level of the delay signal 'signal_d' when the second enable signal 'en2' is enabled at a high level.

The timing comparator 140-1 can include a fourth flip-flop 141-1 and a third inverter IV23. The fourth flip-flop 141-1 is configured to receive the second enable signal 'en2' and the delay signal 'signal_d'. The third inverter IV23 is configured to invert an output signal of the fourth flip-flop 141-1 to output the detection signal 'det'.

The voltage line controlling unit 200 allows a part of current, which is applied to the ground voltage line 'VSSQ' for the data output, to be applied to the ground voltage line 'VSS' in response to the detection signal 'det'. The ground voltage line 'VSSQ' for the data output can supply voltage having a ground voltage level to the data output circuit, and the ground voltage line 'VSS' can supply the voltage having the ground voltage level to the circuits except for the data output circuit. Further, the ground voltage line 'VSSQ' for the data output and the ground voltage line 'VSS' can be connected with the voltage supply pads to receive the external voltage having the ground voltage level.

For example, if the detection signal 'det' is enabled, the voltage line controlling unit 200 interconnects the ground voltage line 'VSSQ' for the data output and the ground voltage line 'VSS'.

Since the voltage line controlling unit 200 has a configuration the same as that of the voltage line controlling unit as shown in FIG. 3, detailed description thereof will be omitted.

The voltage stabilization circuit of the semiconductor memory apparatus according to another embodiment of the disclosure operates as follows.

If the operation speed of the semiconductor memory apparatus is increased, the period of the clock 'CLK' is shortened.

Thus, the operation speed detecting unit 100-1 can detect the period of the clock 'CLK', and compare the period of the clock 'CLK' with the predetermined period to measure the operation speed of the semiconductor memory apparatus.

If the reset signal 'rst' is disabled, the operation speed detecting unit 100-1 allows the first enable signal 'en1' to be enabled at the high level. The first enable signal 'en1' is delayed for one period of the clock 'CLK' such that the first enable signal 'en1' is generated as the second enable signal 'en2', and is delayed for the predetermined delay time such that the first enable signal 'en1' is generated as the delay signal 'signal_d'. Therefore, when the semiconductor memory apparatus operates at a high speed, the enable timing of the second enable signal 'en2' is slower than the enable timing of the first enable signal 'en1' by one period of the clock 'CLK'. Further, when the semiconductor memory apparatus operates at the high speed, the enable timing of the delay signal 'signal_d' is slower than the enable timing of the first enable signal 'en1' by the predetermined delay time.

Then, the operation speed detecting unit 100-1 can compare the enable timing of the delay signal 'signal_d' with the enable timing of the second enable signal 'en2' to output the comparison result as the detection signal 'det'.

When one period of the clock 'CLK' is shorter than the predetermined period (in the case of the high speed operation), the operation speed detecting unit 100-1 can output the detection signal 'det' enabled at a high level. However, when one period of the clock 'CLK' is longer than the predetermined period (in the case of the low speed operation), the operation speed detecting unit 100-1 can output the detection signal 'det' enabled at a low level.

If the detection signal 'det' is enabled, the voltage line controlling unit 200 interconnects the ground voltage line 'VSS' and the ground voltage line 'VSSQ' for the data output. The ground voltage line 'VSSQ' for the data output can supply the ground voltage to the data output circuit, e.g., the output driver.

Thus, when the semiconductor memory apparatus operates at the low speed, the ground voltage line 'VSS' is separated from the ground voltage line 'VSSQ' for the data output. However, when the semiconductor memory apparatus operates at the high speed, the ground voltage line 'VSS' is connected with the ground voltage line 'VSSQ' for the data output.

As a result, the voltage stabilization circuit of the semiconductor memory apparatus according to the embodiment interconnects the ground voltage line and the ground voltage line for the data output during the high speed operation, so that the current applied to the ground voltage line for the data output can be applied to the ground voltage line during the high speed operation. Further, noise components on the ground voltage line for the data output are partially applied to the ground voltage line, so the noise on the ground voltage line for the data output can be reduced, so that the data output circuit (e.g., the output driver) connected with the ground voltage line for the data output is less affected by the voltage noise. Thus, jitter components of data output from the data output circuit can be reduced.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A voltage stabilization circuit of a semiconductor memory apparatus, the voltage stabilization circuit comprising:
   an operation speed detecting unit configured to detect an operation speed of the semiconductor memory apparatus to generate a detection signal; and
   a voltage line controlling unit configured to interconnect a first voltage line and a second voltage line in response to the detection signal, wherein the first voltage line supplies voltage to a data output circuit and second voltage line supplies voltage to a circuit except for the data output circuit.

2. The voltage stabilization circuit of claim 1, wherein a voltage level of the first voltage line is equal to a voltage level of the second voltage line.

3. The voltage stabilization circuit of claim 2, wherein the voltage level of the first voltage line and the voltage level of the second voltage line include a ground level.

4. The voltage stabilization circuit of claim 3, wherein the voltage line controlling unit includes a switching unit that interconnects the first voltage line and the second voltage line if the detection signal is enabled.

5. The voltage stabilization circuit of claim 2, wherein the operation speed detecting unit is configured to enable the detection signal if a predetermined CAS latency signal of a plurality of CAS latency signals is enabled.

6. The voltage stabilization circuit of claim 5, wherein, when a plurality of predetermined CAS latency signals exist and one of the predetermined CAS latency signals is enabled, the detection signal is enabled.

7. A voltage stabilization circuit of a semiconductor memory apparatus, the voltage stabilization circuit comprising:
   an operation speed detecting unit configured to detect an operation speed of the semiconductor memory apparatus to generate a detection signal; and
   a voltage line controlling unit configured to allow a part of current applied to a first voltage line to be applied to a second voltage line in response to the detection signal, wherein the first voltage line supplies voltage to a data output circuit, and the second voltage line supplies voltage to a circuit except for the data output circuit.

8. The voltage stabilization circuit of claim 7, wherein a voltage level of the first voltage line and a voltage level of the second voltage line include a ground level.

9. The voltage stabilization circuit of claim 8, wherein the voltage line controlling unit includes a switching unit that interconnects the first voltage line and the second voltage line if the detection signal is enabled.

10. The voltage stabilization circuit of claim 7, wherein the operation speed detecting unit is configured to enable the detection signal if the operation speed is equal to or faster than a predetermined operation speed after a reset signal is disabled.

11. The voltage stabilization circuit of claim 10, wherein the operation speed detecting unit is configured to measure a period of a clock to generate the detection signal after the reset signal is disabled.

12. The voltage stabilization circuit of claim 11, wherein the operation speed detecting unit is configured to enable the detection signal if the period of the clock is shorter than a predetermined period after the reset signal is disabled.

13. The voltage stabilization circuit of claim 12, wherein the operation speed detecting unit is configured to generate a first enable signal enabled if the reset signal is disabled, generate a second enable signal by delaying the first enable signal by the predetermined period, generate a delay signal by delaying the first enable signal by a predetermined time, and compare enable timing of the second enable signal with enable timing of the delay signal.

14. The voltage stabilization circuit of claim 13, wherein the operation speed detecting unit comprises:
   an enable signal generator configured to generate the first enable signal in response to the reset signal;
   a delay unit configured to generate the delay signal by delaying the first enable signal;
   a clock delay unit configured to output the first enable signal as the second enable signal after the predetermined period; and
   a timing comparator configured to generate the detection signal by comparing the enable timing of the second enable signal with the enable timing of the delay signal.

15. The voltage stabilization circuit of claim 14, wherein the clock delay unit includes N flip-flops (wherein N denotes an odd number equal to or greater than 3) which are serially connected with each other to sequentially receive clocks having levels inverse to a level of the clock, a first flip-flop of the N flip-flops is configured to receive the first enable signal, and a final flip-flop of the N flip-flops is configured to output the second enable signal.

16. The voltage stabilization circuit of claim 15, wherein the N flip-flops are configured to be initialized if the reset signal is enabled.

17. The voltage stabilization circuit of claim 14, wherein the timing comparator is configured to invert a level of the delay signal to output the detection signal if the second enable signal is enabled.

18. A semiconductor memory apparatus comprising:
   a voltage stabilization circuit configured to distribute a part of current, which is applied to a first voltage line, to a second voltage line when an operation speed of the semiconductor memory apparatus is equal to or faster than a predetermined operation speed; and
   a data output circuit configured to receive voltage from the first voltage line to output data out of the semiconductor memory apparatus,
   wherein the second voltage line applies voltage to a circuit except for the data output circuit.

19. The semiconductor memory apparatus of claim 18, wherein the voltage stabilization circuit comprises:
   an operation speed detecting unit configured to enable a detection signal when a value of a CAS latency signal is equal to or larger than a predetermined value; and
   a voltage line controlling unit configured to interconnect the first voltage line and the second voltage line if the detection signal is enabled.

20. The semiconductor memory apparatus of claim 18, wherein the voltage stabilization circuit includes:
   an operation speed detecting unit configured to generate the detection signal by comparing one period of a clock with a predetermined time if a reset is disabled; and
   a voltage line controlling unit configured to interconnect the first voltage line and the second voltage line in response to the detection signal.

21. The semiconductor memory apparatus of claim 18, wherein the first voltage line includes a ground voltage line for data output and the second voltage line includes a ground voltage line.

22. The semiconductor memory apparatus of claim 18, wherein the first voltage line includes an external voltage line for data output and the second voltage line includes an external voltage line.

* * * * *

UNITED STATES PATENT AND TRADEMARK OFFICE
CERTIFICATE OF CORRECTION

PATENT NO.        : 7,983,106 B2
APPLICATION NO.   : 12/494815
DATED             : July 19, 2011
INVENTOR(S)       : Kim et al.

Page 1 of 1

It is certified that error appears in the above-identified patent and that said Letters Patent is hereby corrected as shown below:

On the Title page:

(75) Inventors, at line 2, change "Jeong-Tea Hwang" to --Jeong-Tae Hwang--.

Signed and Sealed this
Thirtieth Day of August, 2011

David J. Kappos
*Director of the United States Patent and Trademark Office*